United States Patent
Aklik et al.

(10) Patent No.: US 8,324,098 B2
(45) Date of Patent: Dec. 4, 2012

(54) VIA AND METHOD OF FORMING THE VIA WITH A SUBSTANTIALLY PLANAR TOP SURFACE THAT IS SUITABLE FOR CARBON NANOTUBE APPLICATIONS

(75) Inventors: Mehmet Emin Aklik, Windham, ME (US); Thomas James Moutinho, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 88 days.

(21) Appl. No.: 12/832,516

(22) Filed: Jul. 8, 2010

(65) Prior Publication Data

US 2012/0007245 A1    Jan. 12, 2012

(51) Int. Cl.
*H01L 23/48* (2006.01)
*H01L 21/4763* (2006.01)

(52) U.S. Cl. ........ 438/656; 438/626; 438/669; 438/672; 257/750; 257/751; 257/763; 257/E21.171; 257/E21.584; 257/E21.585; 257/E23.01

(58) Field of Classification Search ................ 438/626, 438/656, 669, 672; 257/750, 751, 763, E21.171, 257/E21.584, E21.585, E23.01
See application file for complete search history.

(56) References Cited

U.S. PATENT DOCUMENTS

| | | | |
|---|---|---|---|
| 6,265,257 B1 | 7/2001 | Hsu et al. | |
| 6,835,649 B2 | 12/2004 | Lee et al. | |
| 2002/0132470 A1 | 9/2002 | Pallinti et al. | |
| 2003/0038369 A1 * | 2/2003 | Layadi et al. | 257/750 |
| 2004/0038523 A1 | 2/2004 | Kozhukh et al. | |
| 2009/0256217 A1 | 10/2009 | Lu et al. | |
| 2009/0280643 A1 * | 11/2009 | Andry et al. | 438/656 |

OTHER PUBLICATIONS

Yun et al., "Effect of Post-Treatments on Atomic Layer Deposition of TiN Thin Films Using Tetrakis(dimethylamido) titanium and Ammonia", Jpn. J. Appl. Phys., vol. 41, 2002, pp. L418-L421.
Dixit et al., "Ion Metal Plasma (IMP) Deposited Titanium Liners for 0.25/0.18um Multilevel Interconnections", International Electron Devices Meeting, 1996, pp. 357-360.
'Salicide Formation (RTP)'. Chemistry in Action! 53 [online]. Issue 53, [retrived on Jul. 19, 2010]. Retrieved from the internet: <URL: http://www.ul.ie/~childsp/CinA/Issue53/issue53.htm >.
PCT International Search Report for PCT/US2011/038563.
PCT Written Opinion of the International Searching Authority for PCT/US2011/038563.

* cited by examiner

*Primary Examiner* — Dao H Nguyen
(74) *Attorney, Agent, or Firm* — Wade J. Brady, III; Frederick J. Telecky, Jr.

(57) ABSTRACT

A via is formed on a wafer to lie within an opening in a non-conductive structure and make an electrical connection with an underlying conductive structure so that the entire top surface of the via is substantially planar, and lies substantially in the same plane as the top surface of the non-conductive structure. The substantially planar top surface of the via enables a carbon nanotube switch to be predictably and reliably closed.

16 Claims, 3 Drawing Sheets

VIA AND METHOD OF FORMING THE VIA WITH A SUBSTANTIALLY PLANAR TOP SURFACE THAT IS SUITABLE FOR CARBON NANOTUBE APPLICATIONS

BACKGROUND OF THE INVENTION

1. Field of the Invention

The present invention relates to a via and a method of forming the via and, more particularly, to a via and a method of forming the via with a substantially planar top surface.

2. Description of the Related Art

A via is a well-known metal structure that touches and extends vertically up from the top surface of a silicon region, a silicided region, or a metal trace to touch the bottom surface of an overlying metal trace in a metal interconnect structure. Vias which touch the top surface of a silicon region or a silicided region are also known as contacts.

FIGS. 1A-1D show cross-sectional views that illustrate a prior art method of forming a via. As shown in FIG. 1A, the method utilizes a conventionally-formed semiconductor wafer 100 that includes a conductive structure 110 which is formed in a semiconductor structure 112, and a non-conductive structure 114 that touches and overlies conductive structure 110 and semiconductor structure 112. Conductive structure 110 can represent a silicon region, such as a source or drain region, a silicided region formed on silicon or polysilicon, or a metal trace.

As further shown in FIG. 1A, the method begins by forming a patterned photoresist layer 120 on the top surface of non-conductive structure 114. The patterned photoresist layer 120 is formed in conventional manner, which includes depositing a layer of photoresist, projecting a light through a patterned black/clear glass plate known as a mask to form a patterned image on the layer of photoresist to soften the photoresist regions exposed by the light, and removing the softened photoresist regions to expose regions on the top surface of non-conductive structure 114. (Only one exposed region is shown for clarity.)

As shown in FIG. 1B, after patterned photoresist layer 120 has been formed, the exposed region of non-conductive structure 114 is etched to form an opening 122 that exposes the top surface of conductive structure 110. Following the formation of opening 122, patterned photoresist layer 120 is removed.

As shown in FIG. 1C, once patterned photoresist layer 120 has been removed, a titanium/titanium nitride layer 124 is conformally deposited on non-conductive structure 114 to line opening 122 and touch the top surface of conductive structure 110. Following this, a tungsten layer 126 is conformally deposited on titanium/titanium nitride layer 124 to fill opening 122. Titanium/titanium nitride layer 124 and tungsten layer 126 are deposited in a conventional manner, such as by using chemical vapor deposition, plasma vapor deposition, or atomic layer deposition.

As further shown in FIG. 1C, the deposition of tungsten layer 126 forms a seam 130 that extends vertically into the center of opening 122. As tungsten is deposited, the width of opening 122 becomes smaller and smaller until the tungsten on the side wall of opening 122 meets in the center of opening 122 to fill opening 122. Seam 130, in turn, represents the point where the tungsten meets in the center of opening 122.

As shown in FIG. 1D, after tungsten layer 126 has been deposited, tungsten layer 126 and titanium/titanium nitride layer 124 are removed using conventional chemical-mechanical polishing to expose the top surface of non-conductive structure 114, and form a via 132 that includes the remaining portions of titanium/titanium nitride layer 124 and tungsten layer 126.

One problem with conventional chemical-mechanical polishing, commonly known as coring, is that the chemical used in the polishing frequently attacks seam 130 and forms a cavity 134 as further shown in FIG. 1D. During the formation of a conventional metal interconnect structure, a layer of metal is deposited on non-conductive structure 114 and via 132 as part of the process for forming a metal trace. The deposited layer of metal, in turn, fills up cavity 134 in via 132. Thus, in a conventional metal interconnect process, cavity 134 presents no significant issue.

However, when a metal interconnect structure includes a carbon nanotube switch, where the switch is closed by extending down to touch the top surface of via 132, the presence of cavity 134 can prevent the carbon nanotube switch from making a predictable and reliable electrical connection with the top surface of via 132.

FIGS. 2A-2C show cross-sectional views that illustrate examples of a prior-art carbon nanotube switch 200. As shown in FIGS. 2A-2C, switch 200 includes a conductive structure 210 that is formed in a semiconductor structure 212, a non-conductive structure 214 that touches and overlies conductive structure 210 and semiconductor structure 212, and a via 216 that extends through non-conductive structure 214 to make contact with conductive structure 210. Conductive structure 210, in turn, can represent a silicon region, such as a source or drain region, a silicided region formed on silicon or polysilicon, or a metal trace.

As further shown in FIGS. 2A-2C, switch 200 also includes a support layer 220 that touches the top surface of non-conductive structure 214 and via 216. Support layer 220, which is commonly implemented with nitride, includes an opening 222 that exposes the top surface of via 216. In addition, switch 200 further includes a carbon nanotube structure 224 that touches lower support layer 220 and extends across opening 222.

FIG. 2A illustrates via 216 with a substantially planar top surface and carbon nanotube structure 224 lying in the open switch position, while FIG. 2B illustrates via 216 with a substantially planar top surface and carbon nanotube structure 224 lying in the closed switch position. Thus, as shown in FIG. 2B, when switch 200 is closed, carbon nanotube structure 224 extends down to make a predictable and reliable electrical connection with the substantially planar top surface of via 216.

However, as shown in FIG. 2C, when via 216 suffers from coring, via 216 no longer has a substantially planar top surface, but instead has a cavity 226. As a result, when switch 200 is closed and carbon nanotube structure 224 extends down to via 216, carbon nanotube structure 224 touches only the edges of via 216 and, therefore, is no longer able to make a predictable and reliable electrical connection with via 216.

A number of solutions to the problem of via coring have been proposed. For example, U.S. Patent Application Publication 2009/0256217 discusses plating a material into the cavity, forming silicon in the cavity and thermally cycling the silicon to convert the silicon into a silicide, and forming a metal cap on top of the via through a damascene or a conventional metal process.

Although a number of solutions to the problem of via coring have been suggested, there remains a need for alternate approaches to forming a via with a substantially planar top surface.

DETAILED DESCRIPTION OF THE INVENTION

Figure 1A:
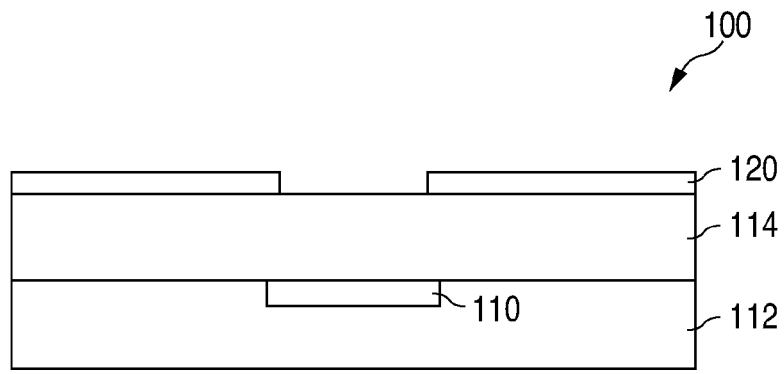
FIGS. 1A-1D are cross-sectional views illustrating a prior art method of forming a via.
Figure 1B:
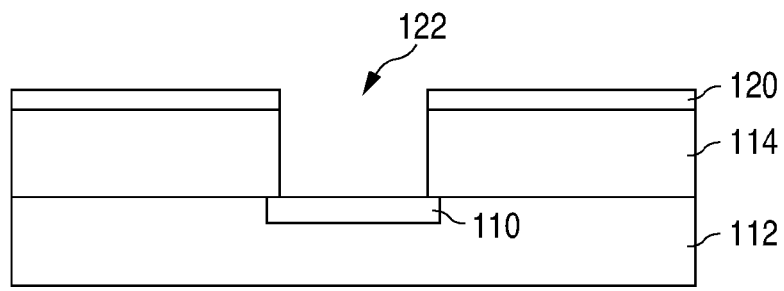
Figure 1C:
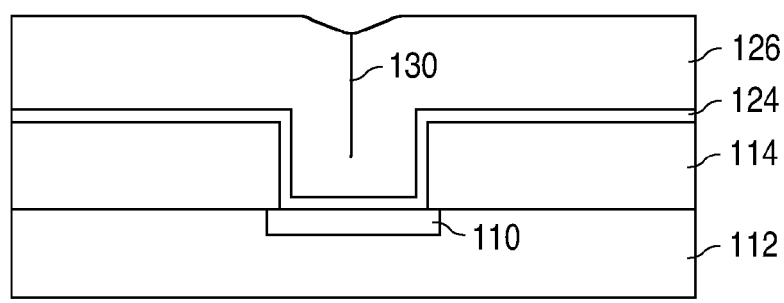
Figure 1D:
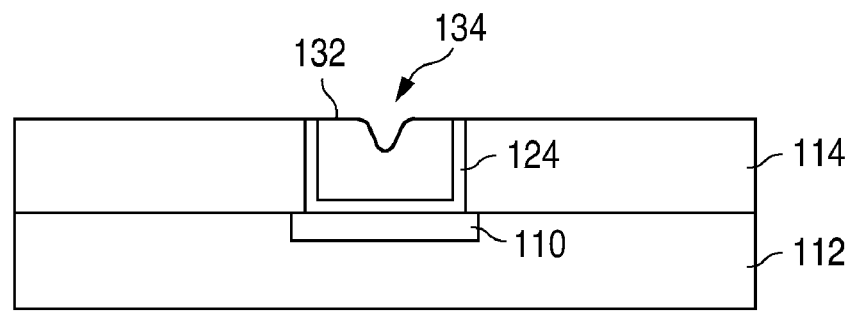
Figure 2A:
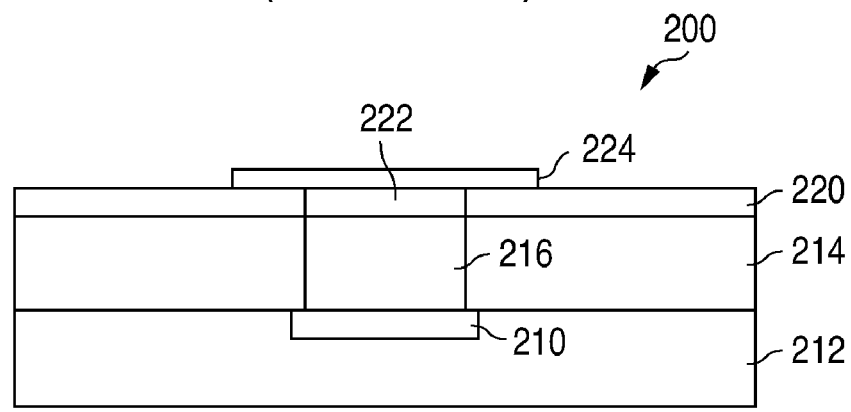
FIGS. 2A-2C are cross-sectional views illustrating an example of a prior-art carbon nanotube switch 200.
Figure 2B:
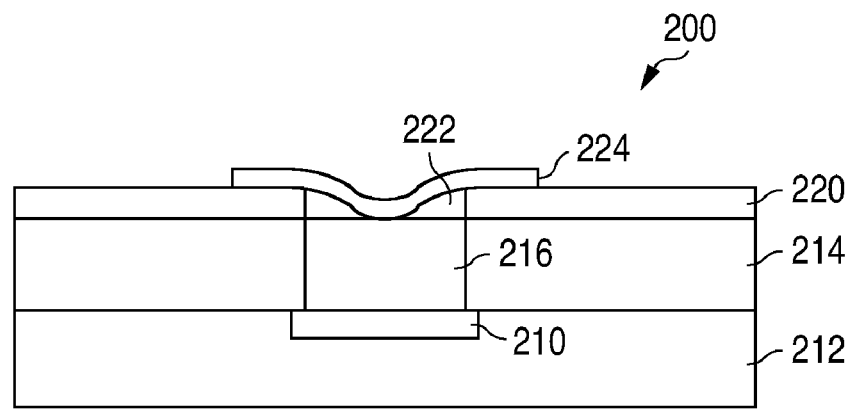
Figure 2C:
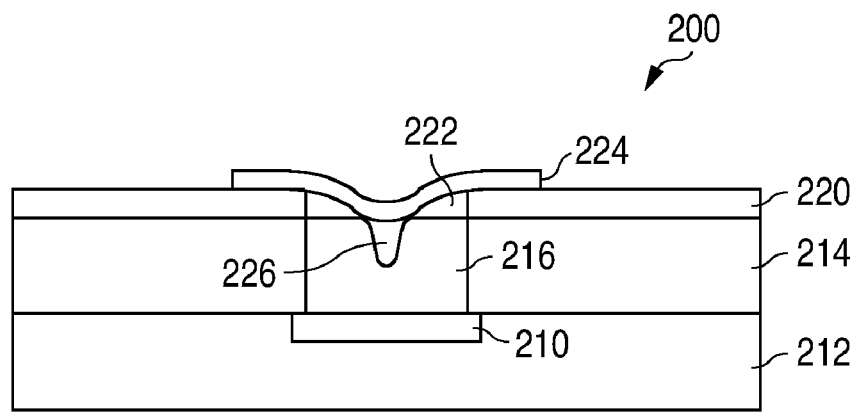
Figure 3A:
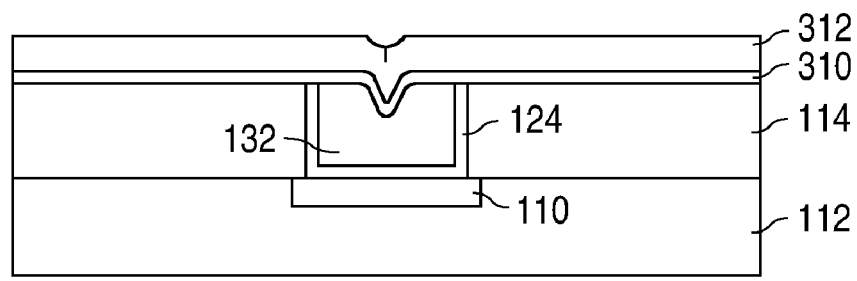
FIGS. 3A-3B are cross-sectional views illustrating an example of a method of forming a via in accordance with the present invention.
Figure 3B:
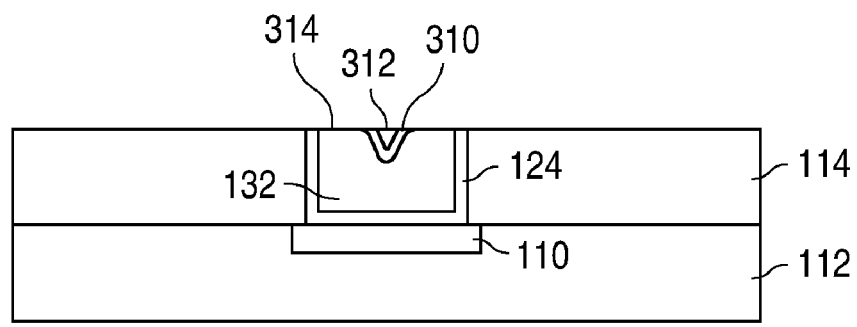

FIGS. 3A-3B show cross-sectional views that illustrate an example of a method of forming a via in accordance with the present invention. As described in greater detail below, the present invention forms a via on a wafer to lie within an opening in a non-conductive structure and make an electrical connection with an underlying conductive structure so that all of the top surface of the via is substantially planar, and so that the top surface of the via lies substantially in the same plane as the top surface of the non-conductive structure.

The method of the present invention follows the same steps illustrated in FIGS. 1A-1D to form via 132 and first differs, as shown in FIG. 3A, by conformally depositing a titanium/titanium nitride layer 310 on non-conductive structure 114 and via 132. Thus, when the chemical-mechanical polishing forms cavity 134, titanium/titanium nitride layer 310 lines cavity 134.

Following this, a tungsten layer 312 is conformally deposited on titanium/titanium nitride layer 310. Thus, when the chemical-mechanical polishing forms cavity 134, tungsten layer 312 fills cavity 134. Titanium/titanium nitride layer 310 and tungsten layer 312 are deposited in a conventional manner, such as by using chemical vapor deposition, plasma vapor deposition, or atomic layer deposition.

As shown in FIG. 3B, after tungsten layer 312 has been deposited, tungsten layer 312 and titanium/titanium nitride layer 310 are removed using conventional chemical-mechanical polishing to expose the top surface of non-conductive structure 114, and form a via 314 that includes via 132 and the remaining portions of titanium/titanium nitride layer 310 and tungsten layer 312. In some cases, where cavity 134 is very shallow, via 314 includes via 132 and only the remaining portions of titanium/titanium nitride layer 310.

In accordance with the present invention, via 314 is formed to have a top surface where the entire top surface of via 314 is substantially planar, and lies substantially in the same plane as the top surface of non-conductive structure 114. Experimental results indicate that via 314 has no coring and is planar to approximately +/−50 Å across the wafer.

Thus, when the chemical-mechanical polishing attacks seam 130 and forms via 132 with cavity 134, the present invention fills cavity 134 with titanium/titanium nitride layer 310 and tungsten layer 312, and then removes the excess material with a second chemical-mechanical polishing to leave via 314.

On the other hand, when the chemical-mechanical polishing forms via 132 without cavity 134, the present invention deposits titanium/titanium nitride layer 310 and tungsten layer 312, and then removes these layers without any damage to via 132. Thus, the present invention ensures that the entire top surface of a via is always formed to be substantially planar.

One of the advantages of the present invention is that a via with a substantially planar top surface is particularly suitable for carbon nanotube applications. For example, the substantially planar top surface of the via allows a carbon nanotube switch, such as switch 200, to be predictably and reliably closed.

The present invention has a number of additional advantages over the prior art solutions. For example, the present invention does not require the time and cost associated with plating or silicide formation. Further, the formation of a metal cap that covers the top surface of a via requires a masking step and the cost associated with the masking step.

In a damascene process, a non-conductive material must be deposited, and then masked and etched to form an opening for the cap. Following this, metal is deposited and then planarized to form the cap. Similarly, in a conventional metal process, a layer of metal is deposited, and then masked and etched to form the cap.

In addition to the cost associated with a masking step, the formation of a metal cap that covers the top surface of a via is also layout dependent. This, in turn, means that each wafer which has a different layout must also incur the cost associated with an additional masking step. The present invention, by contrast, is not layout dependent and can be applied to all wafers.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a via comprising:
   forming an opening in a non-conductive structure, the opening exposing a conductive structure, the non-conductive structure having a top surface;
   depositing a first conductive layer to touch the non-conductive structure, the first conductive layer lining the opening and touching the conductive structure;
   depositing a second conductive layer to touch the first conductive layer;
   removing the second conductive layer and the first conductive layer to expose the top surface of the non-conductive structure, and form a via in the opening, the via having a top surface;
   depositing a third conductive layer to touch the non-conductive structure and the via;
   depositing a fourth conductive layer to touch the third conductive layer; and
   removing the fourth conductive layer and the third conductive layer to expose the top surface of the non-conductive structure.

2. The method of claim 1 wherein all of the top surface of the via is substantially planar after the fourth conductive layer and the third conductive layer have been removed.

3. The method of claim 2 wherein the top surface of the non-conductive structure and the top surface of the via lie substantially in a common plane after the fourth conductive layer and the third conductive layer have been removed.

4. The method of claim 3 wherein the via has a cavity, the third conductive layer lining the cavity.

5. The method of claim 4 wherein the fourth conductive layer fills the cavity.

6. The method of claim 3 wherein:
   the first conductive layer and the third conductive layer include a same conductive material; and
   the second conductive layer and the fourth conductive layer include a same conductive material.

7. The method of claim 3 wherein:
   the second conductive layer and the first conductive layer are removed by chemical-mechanical polishing; and
   the fourth conductive layer and the third conductive layer are removed by chemical-mechanical polishing.

8. The method of claim 3 wherein:
the first conductive layer and the third conductive layer are titanium/titanium nitride; and
the second conductive layer and the fourth conductive layer are tungsten.

9. A method of forming a via comprising:
forming an opening in a non-conductive structure, the opening exposing a conductive structure, the non-conductive structure having a top surface;
depositing a first conductive layer to touch the non-conductive structure, the first conductive layer lining the opening and touching the conductive structure;
depositing a second conductive layer to touch the first conductive layer;
removing the second conductive layer and the first conductive layer to expose the top surface of the non-conductive structure, and form a via in the opening; and
depositing a third conductive layer to touch the non-conductive structure and the via, the first conductive layer and the third conductive layer including a same conductive material.

10. The method of claim 9 and further comprising depositing a fourth conductive layer to touch the third conductive layer.

11. The method of claim 10 and further comprising removing the fourth conductive layer and the third conductive layer to expose the top surface of the non-conductive structure.

12. The method of claim 11 wherein the via has a cavity, the third conductive layer lining the cavity.

13. The method of claim 12 wherein the fourth conductive layer fills the cavity.

14. The method of claim 11 wherein the second conductive layer and the fourth conductive layer include a same conductive material.

15. The method of claim 11 wherein:
the second conductive layer and the first conductive layer are removed by chemical-mechanical polishing; and
the fourth conductive layer and the third conductive layer are removed by chemical-mechanical polishing.

16. The method of claim 11 wherein:
the first conductive layer and the third conductive layer are titanium/titanium nitride; and
the second conductive layer and the fourth conductive layer are tungsten.

* * * * *